US009349770B2

(12) United States Patent
Lenchenkov (10) Patent No.: US 9,349,770 B2
(45) Date of Patent: May 24, 2016

(54) IMAGING SYSTEMS WITH INFRARED PIXELS HAVING INCREASED QUANTUM EFFICIENCY

(71) Applicant: Semiconductor Components Industries, LLC, Phoenix, AZ (US)

(72) Inventor: Victor Lenchenkov, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 24 days.

(21) Appl. No.: 14/178,066

(22) Filed: Feb. 11, 2014

(65) Prior Publication Data
US 2015/0228689 A1    Aug. 13, 2015

(51) Int. Cl.
| H01L 31/0216 | (2014.01) |
| H01L 27/146 | (2006.01) |
| H01L 31/028 | (2006.01) |
| H01L 31/0232 | (2014.01) |

(52) U.S. Cl.
CPC ...... *H01L 27/14649* (2013.01); *H01L 27/1464* (2013.01); *H01L 27/14621* (2013.01); *H01L 27/14629* (2013.01); *H01L 27/14645* (2013.01); *H01L 31/028* (2013.01); *H01L 31/02162* (2013.01); *H01L 31/02327* (2013.01)

(58) Field of Classification Search
CPC ............... H01L 27/14621; H01L 27/14629; H01L 27/1464
See application file for complete search history.

(56) References Cited

U.S. PATENT DOCUMENTS

| 7,759,644 | B2 * | 7/2010 | Mitra et al. ............. | G01J 3/26 250/338.4 |
| 8,329,497 | B2 * | 12/2012 | Qian et al. ........ | H01L 27/14603 250/338.4 |
| 8,648,343 | B2 * | 2/2014 | Yamazaki et al. .... | H01L 27/124 257/43 |
| 2009/0128671 | A1 * | 5/2009 | Kusaka .............. | H04N 5/23212 348/246 |
| 2009/0278452 | A1 * | 11/2009 | Kim ..................... | H01L 25/048 313/504 |
| 2011/0032398 | A1 * | 2/2011 | Lenchenkov ..... | H01L 27/14621 348/294 |
| 2011/0164156 | A1 * | 7/2011 | Hiramoto et al. . | H01L 27/14625 348/272 |
| 2011/0241145 | A1 * | 10/2011 | Lenchenkov ..... | H01L 27/14629 257/432 |
| 2011/0284819 | A1 * | 11/2011 | Kang et al. ............ | B82Y 20/00 257/9 |
| 2012/0145901 | A1 * | 6/2012 | Kakiuchi et al. ....... | G02B 5/208 250/330 |
| 2012/0281099 | A1 * | 11/2012 | Lenchenkov ..... | H01L 27/14603 348/187 |
| 2013/0027577 | A1 * | 1/2013 | Holscher et al. .. | H01L 27/14621 348/222.1 |

\* cited by examiner

*Primary Examiner* — Jaehwan Oh
(74) *Attorney, Agent, or Firm* — Treyz Law Group, P.C.; Andrew C. Milhollin (57) ABSTRACT

An imaging device may include an image sensor having an array of image pixels. The array of image pixels may include one or more infrared pixels that are configured to detect infrared light. The infrared pixels may include reflective structures for increasing quantum efficiency in the infrared spectral range. The reflective structures may include first and second parallel structures formed on opposing sides of a photodiode in an infrared pixel. The reflective structures may be partially transparent to infrared light and non-transparent to visible light. The reflective structures may form an optical cavity so that infrared light that enters an infrared pixel is reflected back and forth between the reflective structures until it is absorbed by the photodiode in the infrared pixel. Reflective structures may also be formed between infrared filters and color filters to suppress optical crosstalk between infrared pixels and color pixels.

19 Claims, 6 Drawing Sheets

IMAGING SYSTEMS WITH INFRARED PIXELS HAVING INCREASED QUANTUM EFFICIENCY

BACKGROUND

This relates generally to imaging devices, and more particularly, to imaging devices that include infrared pixels.

Modern electronic devices such a cellular telephones, cameras, and computers often use digital image sensors. Imagers (i.e., image sensors) may be formed from a two-dimensional array of image sensing pixels. Each pixel may include a photosensor such as a photodiode that receives incident photons (light) and converts the photons into electrical signals. Image sensors are sometimes designed to provide images to electronic devices using a Joint Photographic Experts Group (JPEG) format or any other suitable image format.

Some imaging systems may include image sensors that are configured to capture images in both the infrared spectral range as well as the visible spectral range. Other imaging systems may include image sensors that are configured to capture images exclusively in the infrared spectral range. Infrared imaging can be used for a number of different applications such as three-dimensional (3D) imaging, automatic focusing, and other applications. In conventional image sensors, however, infrared pixels suffer from low quantum efficiency. It can also be difficult to separate signals corresponding to infrared light from signals corresponding to visible light. If care is not taken, infrared light received by color pixels in the image sensor can degrade the quality of images captured in the visible spectrum.

It would therefore be desirable to be able to provide improved imaging devices for capturing images in both the infrared and visible spectral ranges.

DETAILED DESCRIPTION

Electronic devices such as digital cameras, computers, cellular telephones, and other electronic devices include image sensors that gather incoming light to capture an image. The image sensors may include arrays of image pixels. The image pixels in the image sensors may include photosensitive elements such as photodiodes that convert the incoming light into electric charge. The electric charges may be stored and converted into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
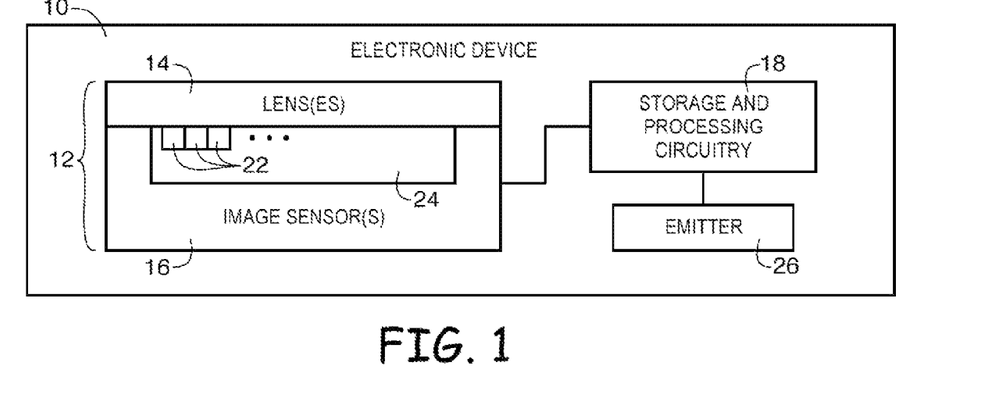
FIG. 1 is a diagram of an illustrative electronic device having a camera module in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. If desired, camera module 12 may be provided with an array of lenses 14 and an array of corresponding image sensors 16. During image capture operations, light from a scene may be focused onto image sensor 16 by lens 14. Image sensor 16 provides corresponding digital image data to processing circuitry 18. Image sensor 16 may be a front side illuminated image sensor or may, if desired, be a backside illumination image sensor. Arrangements in which image pixels 22 are backside illumination image pixels are sometimes described herein as an example. This is, however, merely illustrative. If desired, image pixels 22 may be front side illumination image pixels.

Control circuitry such as storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18. Processing circuitry 18 may be used in controlling the operation of image sensors 16.

Image sensors 16 may include one or more arrays 24 of image pixels 22. Image pixels 22 may be formed in a semiconductor substrate using complementary metal-oxide-semiconductor (CMOS) technology or charge-coupled device (CCD) technology or any other suitable technology for forming photosensitive devices.

Camera module 12 may have one or more image sensors 16 that are configured to capture images in the infrared spectral range. For example, device 10 may include an emitter such as infrared emitter 26. Infrared emitter 26 may be an infrared laser that is used to illuminate a scene with infrared light. During infrared imaging operations, infrared light that is reflected from a scene towards image sensor 16 will be detected by imaging pixels 22 that are sensitive to infrared light. This is, however, merely illustrative. If desired, emitter 26 may be omitted from device 10 and/or image sensor 16 may detect infrared light from other light sources.

Figure 2:
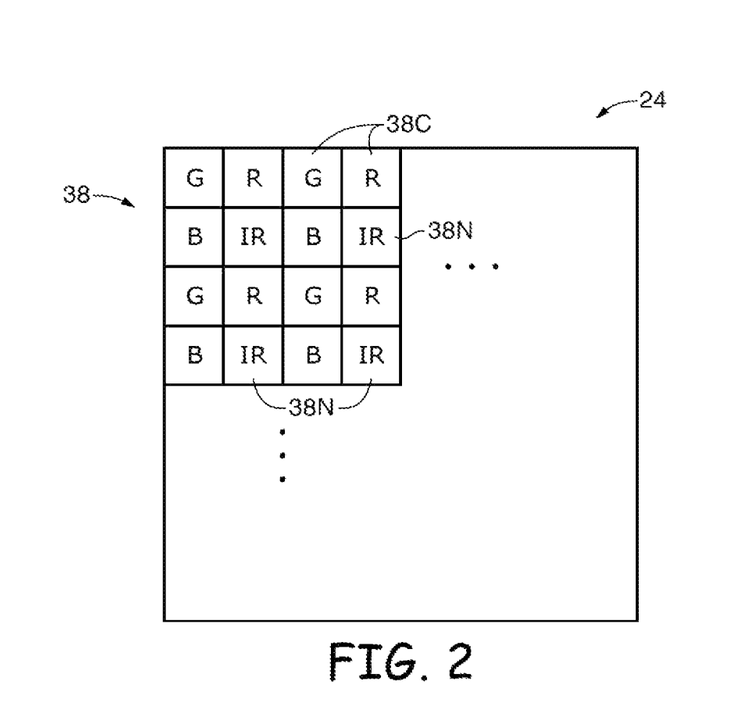
FIG. 2 is a top view of a pixel array that includes both color pixels and infrared pixels in accordance with an embodiment of the present invention.

An array of color filters and infrared filters may be formed over photosensitive elements of pixel array 24 to allow for simultaneous visible and infrared imaging. FIG. 2 is a top view of an illustrative pixel array that includes an array of filter elements such as color filter array 38. Color filter array 38 may include color filters such as color filters 38C and infrared filters such as infrared filters 38N. Each filter may be formed over an associated photosensor. Pixels that include color filters 38C are sometimes referred to herein as "color pixels." Pixels that include infrared filters 38N are sometimes referred to as "near infrared pixels" or "infrared pixels." Infrared pixels may, for example, be configured to detect light having wavelengths between 700 nm and 900 nm, between 700 nm and 1 micron, etc.

Each filter in color filter array 38 may be optimized to pass one or more wavelength bands of the electromagnetic spectrum. For example, red color filters may be optimized to pass a wavelength band corresponding to red light, blue color filters may be optimized to pass a wavelength band corresponding to blue light, green color filters may be optimized to pass a wavelength band corresponding to green light, and infrared filters may be optimized to pass a wavelength band corresponding to infrared light (e.g., near infrared light). If desired, infrared color filters 38N may be formed from a mixture of red, blue, and green color filter material or may be formed from other suitable materials that block visible light while allowing infrared light to pass.

Color pixels and infrared pixels may be arranged in any suitable fashion. In the example of FIG. 2, color filter array 38 is formed in a "quasi-Bayer" pattern. With this type of arrangement, array 38 is composed of 2×2 blocks of filter elements in which each block includes a green color filter element, a red color filter element, a blue color filter element, and an infrared filter element in the place where a second green color filter element would be located in a typical Bayer array.

This is, however, merely illustrative. If desired, there may be greater or fewer near infrared pixels distributed throughout array 24. For example, array 24 may include one infrared pixel in each 4×4 block of pixels, each 8×8 block of pixels, each 16×16 block of pixels, etc. As additional examples, there may be only one infrared pixel for every other 2×2 block of pixels, there may be only one infrared pixel for every five 2×2 blocks of pixels, there may be only one infrared pixel in the entire array of pixels, or there may be one or more rows, columns, or clusters of infrared pixels in the array. In general, near infrared pixels may be scattered throughout the array in any suitable pattern. The example of FIG. 2 is merely illustrative.

Figure 3:
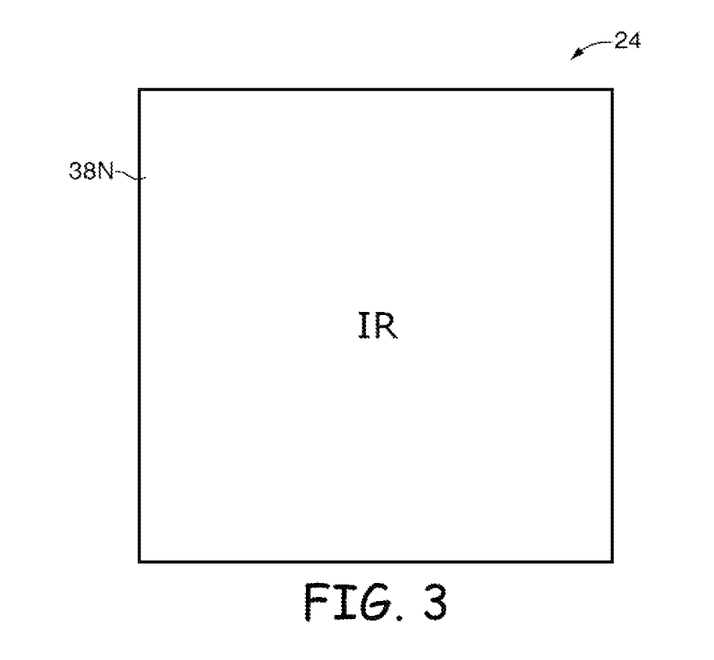
FIG. 3 is a top view of a pixel array that includes exclusively infrared pixels in accordance with an embodiment of the present invention.

If desired, one or more image sensors 16 in camera module 12 of FIG. 1 may be configured to detect light exclusively in the infrared spectral range. For example, as shown in FIG. 3, pixel array 24 may include an infrared filter such as infrared filter 38N that covers the entire array of pixels.

Infrared pixels may include one or more reflective structures for increasing quantum efficiency in the infrared spectral range. In configurations of the type shown in FIG. 2 where infrared pixels are adjacent to color pixels, the reflective structures may also help minimize optical crosstalk between the infrared pixels and color pixels. Arrangements of the type shown FIG. 2 in which pixel array 24 includes both color pixels and infrared pixels are sometimes described herein as an example. However, it should be understood that the reflective structures in infrared pixels 22' of FIGS. 4-6 may be used in image sensors that include exclusively infrared pixels.

Figure 4:
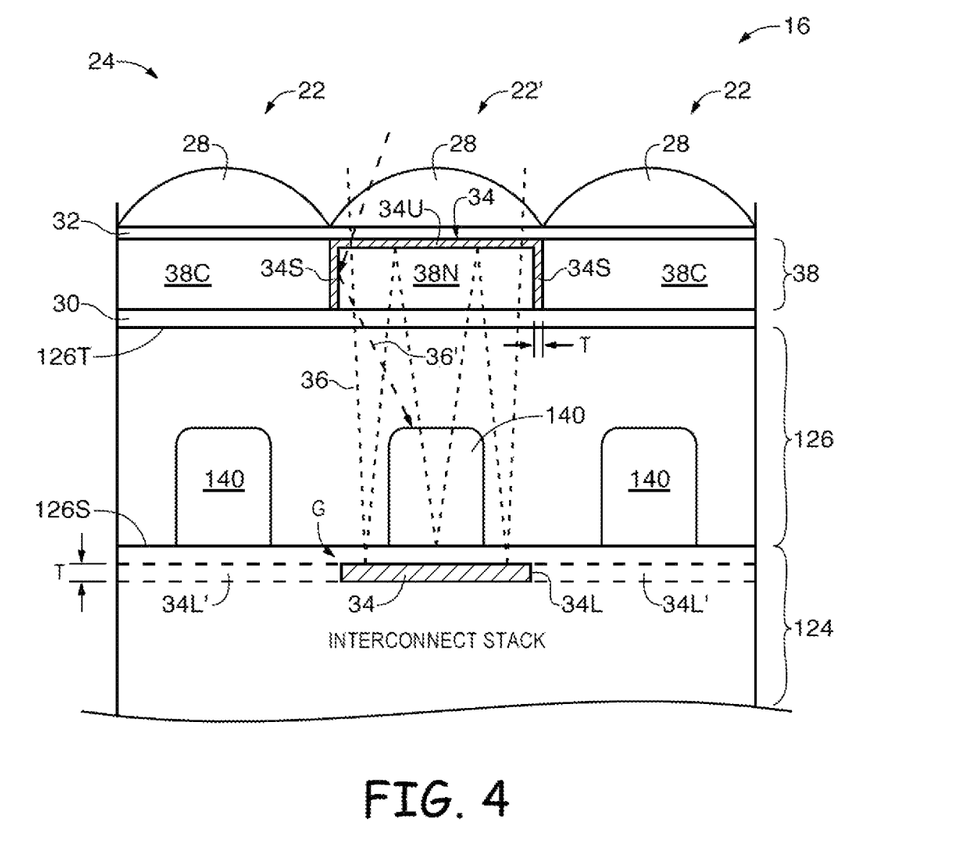
FIG. 4 is a cross-sectional side view of a portion of an illustrative image sensor having infrared pixels with reflective structures for increasing sensitivity to infrared light in accordance with an embodiment of the present invention.

FIG. 4 is a cross-sectional side view of a portion of image sensor 16 showing how infrared pixels may be provided with reflective structures for increased infrared sensitivity. As shown in FIG. 4, each pixel 22 may include a photosensitive element such as photodiode 140 formed in surface 126S of substrate layer 126 (e.g., a p-type silicon substrate). Other pixel structures (e.g., floating diffusion regions, pixel transistors, etc.) may also be formed in surface 126S of substrate 126. Substrate 126 may, for example, have a thickness of 1500-2000 nanometers, 1800-2000 nanometers, 2000-2500 nanometers, less than 2000 nanometers, greater than 2000 nanometers, etc.

A color filter array such as color filter array 38 may be formed over surface 126T of substrate 126. Each color filter element in color filter array 38 may overlap a corresponding photodiode 140. Color filter array 38 may include color filter elements 38C and infrared filter elements 38N. In the example of FIG. 4, infrared pixel 22' includes infrared filter element 38N and is interposed between two color pixels 22 having color filter elements 38C.

An array of microlenses such as microlenses 28 may be formed over color filter array 38. Each microlens may be configured to direct light from a scene towards an associated photodiode 140. If desired, a planarization layer such as planarization layer 32 may be interposed between microlenses 28 and color filter array 38. A passivation layer such as passivation layer 30 may be interposed between color filter array 38 and substrate 126.

A dielectric stack such as dielectric stack 124 may be formed on surface 126S of substrate 126. Dielectric stack 124 may be formed from dielectric material such as silicon oxide or other dielectric material. Interconnect routing structures such as conductive signal routing paths and conductive vias may be formed in dielectric stack 124 to contact the various pixel transistor terminals in substrate 126. Dielectric stack 124 may therefore sometimes be referred to as an interconnect stack.

To increase quantum efficiency of infrared pixels 22', pixel array 24 may include one or more reflective structures such as reflective structures 34. As shown in FIG. 4, reflective structures 34 may include an upper reflector such as upper reflector 34U and an opposing lower reflector such as lower reflector 34L, positioned in pixel array 24 such that photodiode 140 of infrared pixel 22' is interposed between upper reflector 34U and lower reflector 34L. Reflective structures 34 may be partially transparent to infrared light such that some infrared light is transmitted through reflective structures 34 and some infrared light is reflected by reflective structures 34. In this way, infrared light 36 that enters through microlens 28 of infrared pixel 22' may be reflected back and forth between upper reflector 34U and lower reflector 34L until it is absorbed by photodiode 140. The presence of reflectors 34 above and below photodiode 140 therefore creates an optical cavity in which infrared light may be contained (as it is reflected between upper reflector 34U and lower reflector 34L) until absorbed by photodiode 140, thus leading to a significant increase in pixel sensitivity to infrared light (e.g., a quantum efficiency of four to five times that of infrared pixels without reflectors 34).

As shown in FIG. 4, the surfaces of reflectors 34U and 34L may both be oriented parallel to surface 126S of substrate 26. Reflectors 34U and 34L may have planar surfaces or may, if desired, have curved surfaces. Because reflectors 34U and 34L are sometimes formed from flat thin parallel layers, reflectors 34U and 34L may sometimes be referred to as parallel plates.

In the example of FIG. 4, upper reflective structure 34U is formed on the upper surface of infrared filter 38N (e.g., interposed between filter 38N and microlenses 28), and lower reflective structure 34L is formed in dielectric stack 124 under photodiode 140 of infrared pixel 22'. If desired, lower reflective structure 34L may be separated from photodiode 140 by a gap G. Providing space between reflective structure 34L and photodiode 140 may ensure that the reflective structure 34L does not interfere with the operation of photodiode 140.

If desired, reflective structures 34 may be configured to fully block light in the visible spectrum. For example, reflective structure 34 may have a thickness T that is negligible for light of longer wavelengths (e.g., infrared light) while being sufficiently thick to absorb light of shorter wavelengths (e.g., visible light). Thickness T of reflective structures 34 may, for example, be 1-5 nanometers, 1-10 nanometers, less than 10 nanometers, less than 5 nanometers, more than 5 nanometers, etc. If desired, the thickness of lower reflector 34L may be equal to that of upper reflector 34U or lower reflector 34L and upper reflector 34U may have different thicknesses (e.g., lower reflector 34L may be thicker than upper reflector 34U, if desired).

Because reflective structures 34 are configured to block visible light, reflective structures may, if desired, be used as crosstalk reduction structures. For example, as shown in FIG. 4, reflective structures 34 may include sidewall portions 34S that form barriers between infrared filter 38N and color filter 38C. By using reflective structure 34S as a barrier between infrared and non-infrared pixels, infrared light such as infrared light 36' may not only be prevented from passing from infrared pixel 22' to color pixel 22, but may also be redirected towards photodiode 140 of infrared pixel 22'. Upper reflective structure 34U and sidewall reflective structures 34S may together form a structure having U-shaped cross-section, with the bottom of the U-shape facing microlenses 28.

This is, however, merely illustrative. If desired, sidewall portions 34S of reflective structure 34 may be omitted.

Suitable materials that may be used to form reflective structures 34 include copper, aluminum, tungsten, oxide, silicon carbide, silicon nitride, titanium nitride, tantalum nitride, other suitable materials (e.g., other suitable metals, ceramics, etc.), or a combination of any two or more of these materials. In one illustrative embodiment, reflective structures 34 may be formed from a thin layer of copper. In another suitable embodiment, reflective structures 34 may be formed from multiple layers of dielectric material having different indices of refraction to form an interference filter. For example, reflective structures 34 may include one or more layers of oxide (e.g., having a refractive index of 1.46) and one or more layers of silicon carbide (e.g., having a refractive index of 2.6), alternated with each other in a stack to form an interference filter.

Using interference filters to form reflective structures 34 may allow structures 34 to be highly tunable. For example, the thickness of each individual dielectric layer in structures 34 may be configured such that the optical properties of structures 34 are determined with a high degree of accuracy. This is, however, merely illustrative. If desired, reflective structures 34 may be formed from other suitable materials such as metal.

If desired, lower reflective structure 34L may be located only under infrared pixels 22' or may be located under the entire array of pixels 22 (as indicated by dotted lines 34L'). In configurations where lower reflective structure 34L is formed only under some of pixels 22 (e.g., only under infrared pixels 22'), the lower reflective structure 34L may first be deposited in a single contiguous layer under the entire array before being patterned (e.g., using photolithographic techniques) such that the remaining portions of structure 34L are only located under certain pixels such as infrared pixels 22'.

Reflective structures 34 may be deposited using atomic laser deposition (e.g., at a 65 nm node), chemical vapor deposition, physical vapor deposition, and/or using any other suitable techniques. If desired, lower reflective structure 34L may be formed from metal interconnect structures in interconnect stack 124. For example, conductive signal paths and metal vias that are used for interconnecting pixel circuitry may also be configured to form part or all of lower reflective structure 34L. This is, however, merely illustrative. If desired, lower reflective structure 34L may be separate from the metal interconnect structures in layer 124.

Figure 5:
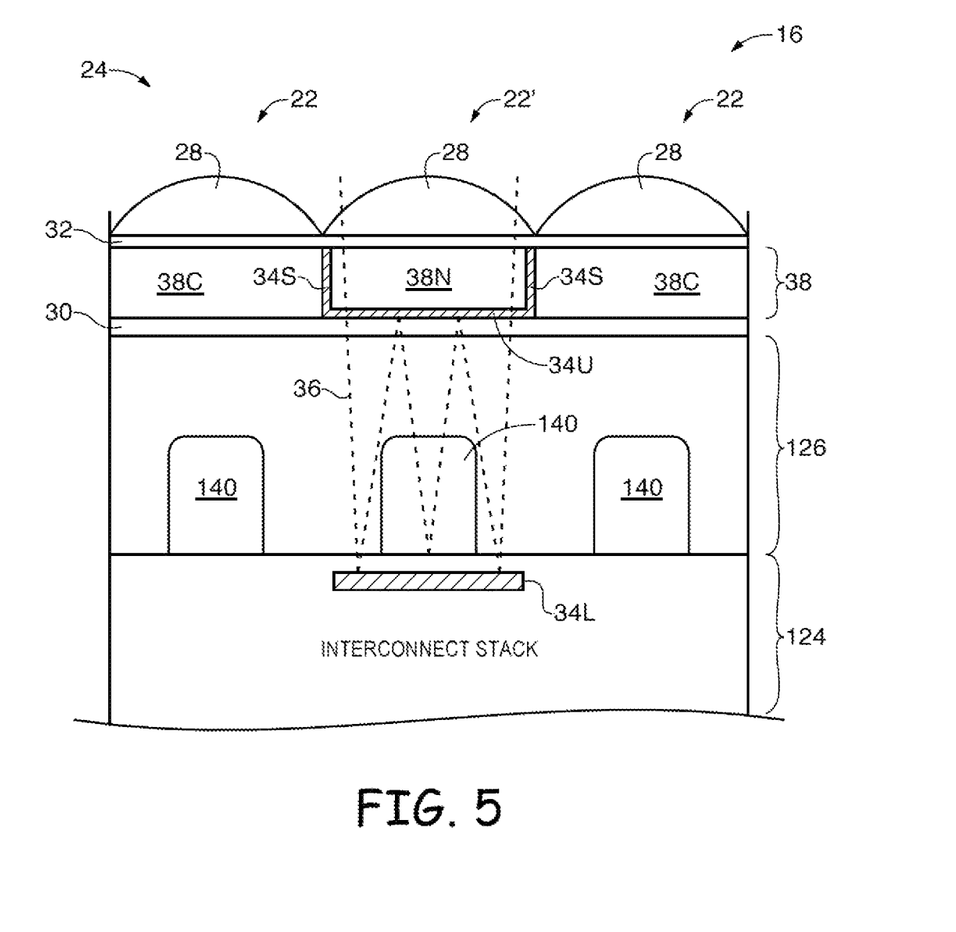
FIG. 5 is a cross-sectional side view of a portion of an illustrative image sensor having infrared pixels with reflective structures for increasing sensitivity to infrared light in accordance with an embodiment of the present invention.

The example of FIG. 4 in which upper reflector 34U is formed above infrared filter 38N (e.g., interposed between infrared filter 38N and microlens 28) is merely illustrative. If desired, upper reflector 34U may be formed below infrared filter 38N. FIG. 5 is a cross-sectional side view of a portion of image sensor 16 showing how upper reflector 34U is formed below infrared filter 38N (e.g., interposed between infrared filter 38N and photodiode 140). As shown in FIG. 5, upper reflective structure 34U and sidewall reflective structures 34S may together form a structure having U-shaped cross-section, with the top of the U-shape facing microlenses 28.

In this type of arrangement, infrared light 36 that enters through microlens 28 of infrared pixel 22' may be reflected back and forth between upper reflector 34U at the lower surface of infrared filter 38N and lower reflector 34L until it is absorbed by photodiode 140. As with the arrangement of FIG. 4, the optical cavity created by reflectors 34 above and below photodiode 140 leads to a significant increase in pixel sensitivity to infrared light.

Figure 6:
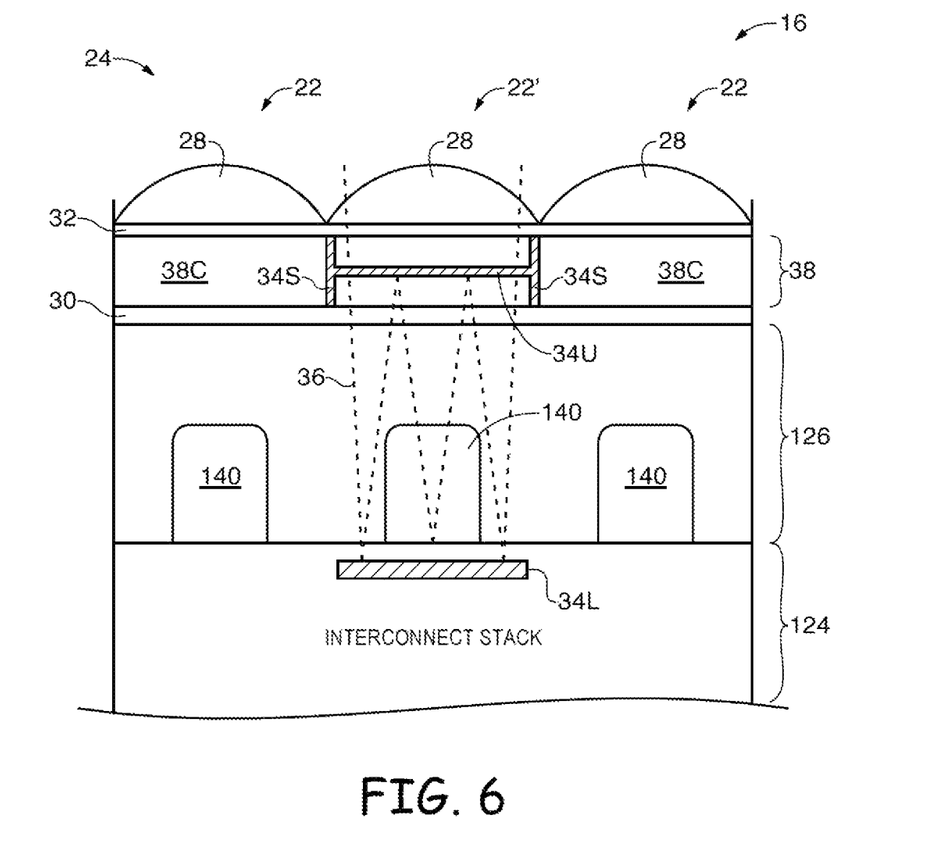
FIG. 6 is a cross-sectional side view of a portion of an illustrative image sensor having infrared pixels with reflective structures for increasing sensitivity to infrared light in accordance with an embodiment of the present invention.

The examples of FIGS. 4 and 5 in which upper reflector 34U is formed at either the upper or lower surface of infrared filter 38N are merely illustrative. If desired, upper reflector 34U may be formed within infrared filter 38N. FIG. 6 is a cross-sectional side view of a portion of image sensor 16 showing how upper reflector 34U is formed within infrared filter 38N (e.g., interposed between first and second portions of infrared filter 38N). As shown in FIG. 6, upper reflective structure 34U and sidewall reflective structures 34S may together form a structure having an H-shaped cross-section.

As with the arrangements of FIGS. 4 and 5, upper reflector 34U and lower reflector 34L of FIG. 6 form an optical cavity in which infrared light 36 is reflected back and forth until it is absorbed by photodiode 140, thereby leading to a significant increase in pixel sensitivity to infrared light.

Figure 7:
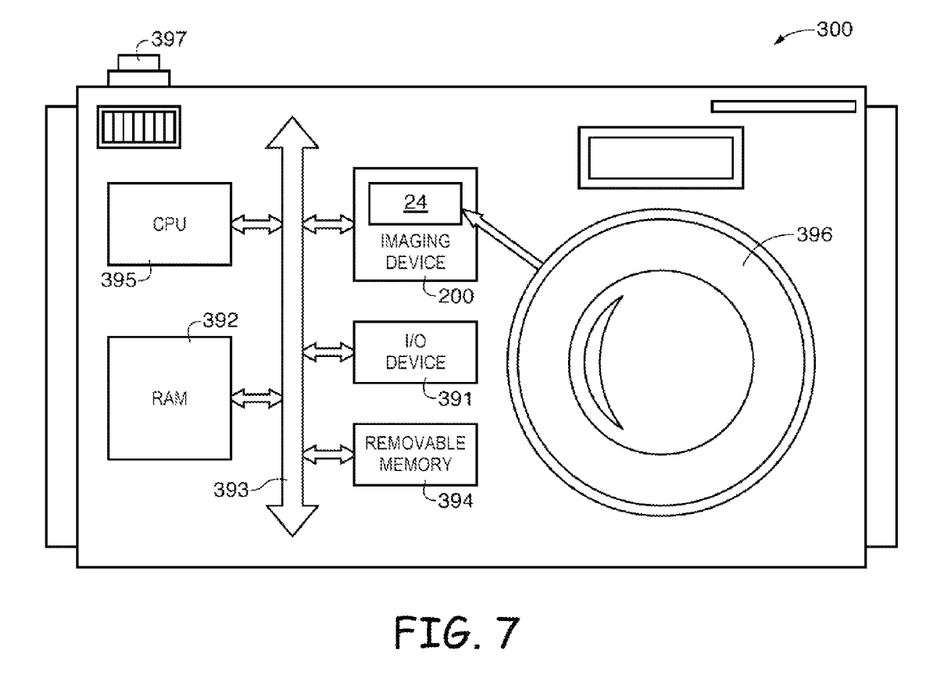
FIG. 7 is a block diagram of an system employing the embodiments of FIGS. 1-6 in accordance with an embodiment of the present invention.

FIG. 7 shows in simplified form a typical processor system 300, such as a digital camera, which includes an imaging device 200. Imaging device 200 may include a pixel array 24 of the type shown in FIG. 1 (e.g., pixel array 24 having highly sensitive infrared pixels with reflective structures 34 as described above) formed on an image sensor SOC. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM)

392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensors such as backside illuminated image sensors having pixel arrays that include infrared pixels. The pixel arrays may include exclusively infrared pixels or the pixel arrays may include both color pixels and infrared pixels. An image sensor having color pixels and infrared pixels may be capable of simultaneously capturing images in the visible and infrared spectral ranges and may be used in an electronic device.

The pixel array may include an array of photodiodes formed in a silicon substrate. The silicon substrate may be formed over a dielectric interconnect stack having conductive signal paths. A color filter array may be formed over the array of photodiodes, and a corresponding array of microlenses may be formed over the color filter array.

Infrared pixels in a pixel array may be positioned in any suitable pattern. In one embodiment, each two-by-two block of pixels may include one infrared pixel and three color pixels. This is, however, merely illustrative. If desired, other patterns may be used or the entire pixel array may be formed exclusively with infrared pixels.

Infrared image pixels in the pixel array may include reflective structures that increase the quantum efficiency of the infrared pixels. The reflective structures may include opposing first and second reflectors formed on either side of a photodiode in an infrared pixel. For example, an upper reflector may be located above the photodiode (e.g., in the color filter layer) and a lower reflector may be located below the photodiode (e.g., in the dielectric interconnect stack below the array of photodiodes).

The upper and lower reflectors may be non-transparent to visible light and partially transparent to infrared light. Infrared light that enters an infrared pixel may be reflected back and forth by the upper and lower reflectors until the infrared light is absorbed by the photodiode in the infrared pixel. In this way, the upper and lower reflectors create an optical cavity in which infrared light can be contained until it is absorbed, thereby leading to a significant increase in quantum efficiency in the infrared spectral range.

If desired, reflective structures may also form barriers between infrared filters and color filters to reduce optical crosstalk between infrared pixels and color pixels. These reflective structures may be in contact with and perpendicular to the upper reflector above the photodiode.

The lower reflector may be located under the entire array of pixels or may be patterned such that it is located only under certain pixels in the array.

Suitable materials that may be used to form the reflective structures include copper, aluminum, tungsten, oxide, silicon carbide, silicon nitride, titanium nitride, tantalum nitride, other suitable materials (e.g., other suitable metals, ceramics, etc.), or a combination of any two or more of these materials. In one illustrative embodiment, the reflective structures are formed from a thin layer of copper. In another suitable embodiment, the reflective structures are formed from multiple layers of dielectric material having different indices of refraction to form an interference filter.

In one illustrative configuration, the upper reflector may be located above the infrared filter in the infrared pixel (e.g., interposed between the infrared filter and a microlens). In another illustrative configuration, the upper reflector may be located below the infrared filter in the infrared pixel (e.g., interposed between the infrared filter and the photodiode). In yet another suitable embodiment, the upper reflector may be located within the infrared filter (e.g., interposed between upper and lower portions of the infrared filter).

The foregoing is merely illustrative of the principles of this invention which can be practiced in other embodiments.

What is claimed is:

1. A backside illuminated image sensor having an array of image pixels including at least one infrared pixel configured to detect infrared light, comprising:
   a substrate having a surface;
   a photodiode array formed in the surface, wherein a photodiode in the photodiode array is associated with the infrared pixel;
   an array of filter elements formed over the array of photodiodes, wherein the array of filter elements includes an infrared filter element associated with the infrared pixel; and
   at least one reflective structure in the infrared pixel, wherein the at least one reflective structure comprises a reflective layer that is configured to reflect the infrared light towards the photodiode associated with the infrared pixel, and wherein the reflective layer is non-transparent to visible light and partially transparent to infrared light.

2. The image sensor defined in claim 1 wherein the reflective layer is an upper reflective layer, wherein the at least one reflective structure further comprises a lower reflective layer, wherein the upper reflective layer and the lower reflective layer are oriented parallel to the surface of the substrate, wherein the photodiode is interposed between the upper and lower reflective layers, and wherein the upper and lower layers are configured to reflect the infrared light towards one another until the infrared light is absorbed by the photodiode.

3. The image sensor defined in claim 2 wherein the array of filter elements comprises at least one color filter element, wherein the at least one reflective structure comprises at least one sidewall reflective structure that is perpendicular to and in contact with the upper reflective layer, and wherein the sidewall reflective structure is interposed between the infrared filter element and the color filter element.

4. The image sensor defined in claim 2, wherein the upper reflective layer is only partially transparent to infrared light.

5. The image sensor defined in claim 4 wherein the upper reflective layer comprises metal.

6. The image sensor defined in claim 4 wherein the at least one reflective structure comprises an interference filter having multiple layers of dielectric material with different indices of refraction.

7. The image sensor defined in claim 4 further comprising a dielectric material formed on the surface of the substrate, wherein the lower reflective layer is formed in the dielectric material and wherein the upper reflective layer is formed on the infrared filter element.

8. The image sensor defined in claim 4 wherein the upper reflective layer has a thickness of less than 5 nanometers.

9. An infrared pixel configured to detect infrared light, comprising:
   a silicon substrate having opposing first and second surfaces;
   a photodiode formed in the first surface;
   an infrared filter formed on the second surface over the photodiode; and first and second reflective structures oriented parallel to the first surface, wherein the first reflective structure is formed below the first surface, wherein the second reflective structure is formed above the second surface such that the photodiode is interposed between the first and second reflective structures, wherein the first and second reflective structures form an optical cavity in which the infrared light is contained until it is absorbed by the photodiode, and wherein the second reflective structure is located in the infrared filter such that the second reflective structure is interposed between first and second portions of the infrared filter.

10. The infrared pixel defined in claim 9 wherein the first and second reflective structures are non-transparent to visible light and partially transparent to infrared light and wherein the first and second reflective structures each comprise a layer of metal having a thickness of less than 10 nanometers.

11. The infrared pixel defined in claim 9 wherein the first and second reflective structures are non-transparent to visible light and partially transparent to infrared light and wherein the first and second reflective structures each comprise an interference filter.

12. The infrared pixel defined in claim 9 further comprising a dielectric layer formed on the first surface, wherein the first reflective structure is located in the dielectric layer under the photodiode.

13. The infrared pixel defined in claim 12 further comprising a microlens, wherein the second reflective structure is interposed between the microlens and the infrared filter.

14. The infrared pixel defined in claim 12 wherein the second reflective structure is interposed between the infrared filter and the second surface of the silicon substrate.

15. The infrared pixel defined in claim 9 further comprising third and fourth reflective structures, wherein the third and fourth reflective structures are non-transparent to visible light, wherein the third and fourth reflective structures are perpendicular to the second reflective structure and wherein the infrared filter is interposed between the third and fourth reflective structures.

16. A system, comprising:
a central processing unit;
memory;
input-output circuitry; and
an imaging device having a backside illuminated image sensor, wherein the backside illuminated image sensor comprises at least one infrared pixel and wherein the at least one infrared pixel comprises:
a silicon substrate having opposing first and second surfaces;
a photodiode formed in the first surface;
an array of color filter elements formed on the second surface;
an infrared filter formed over the photodiode and located between at least some of the color filter elements;
a microlens formed over the infrared filter; and
first and second reflective structures oriented parallel to the first surface, wherein the first reflective structure is formed below the first surface, wherein the second reflective structure is formed above the second surface such that the photodiode is interposed between the first and second reflective structures, wherein the first and second reflective structures form an optical cavity in which the infrared light is contained until it is absorbed by the photodiode, and wherein the second reflective structure is interposed between the infrared filter and the microlens.

17. The system defined in claim 16 wherein the first and second reflective structures are non-transparent to visible light and partially transparent to infrared light and wherein the first and second reflective structures each comprise a layer of metal having a thickness of less than 10 nanometers.

18. The system defined in claim 16 wherein the first and second reflective structures are non-transparent to visible light and partially transparent to infrared light and wherein the first and second reflective structures each comprise an interference filter.

19. The system defined in claim 16 wherein the infrared pixel further comprises a dielectric layer formed on the first surface and a microlens formed over the infrared filter, wherein the first reflective structure is located in the dielectric layer under the photodiode and wherein the second reflective structure is interposed between the microlens and the infrared filter.

* * * * *